(12) United States Patent
Fletcher et al.

(10) Patent No.: US 8,247,319 B1
(45) Date of Patent: Aug. 21, 2012

(54) METHOD TO ENABLE THE PROCESS AND ENLARGE THE PROCESS WINDOW FOR SILICIDE, GERMANIDE OR GERMANOSILICIDE FORMATION IN STRUCTURES WITH EXTREMELY SMALL DIMENSIONS

(75) Inventors: Benjamin Luke Fletcher, Elmsford, NY (US); Christian Lavoie, Pleasantville, NY (US); Siegfried Lutz Maurer, Stormville, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/022,474

(22) Filed: Feb. 7, 2011

(51) Int. Cl.
*H01L 21/28* (2006.01)
*H01L 21/44* (2006.01)

(52) U.S. Cl. ........ 438/581; 438/583; 438/664; 438/682; 257/E21.164; 257/E21.165; 977/890; 977/900

(58) Field of Classification Search .................. 438/581, 438/583, 664, 683; 257/E21.164, E21.165, 257/E21.622; 977/755, 842, 846, 890, 900
See application file for complete search history.

(56) References Cited

U.S. PATENT DOCUMENTS

| | | | |
|---|---|---|---|
| 6,159,856 A | 12/2000 | Nagano | |
| 6,444,578 B1 | 9/2002 | Cabral, Jr. et al. | |
| 7,517,795 B2 | 4/2009 | Carruthers et al. | |
| 7,795,677 B2 | 9/2010 | Bangsaruntip et al. | |
| 2006/0264046 A1* | 11/2006 | Tsuchiaki | 438/682 |
| 2007/0246781 A1* | 10/2007 | Tsuchiaki | 257/369 |
| 2007/0286945 A1* | 12/2007 | Lahnor et al. | 427/80 |
| 2008/0061284 A1 | 3/2008 | Chu et al. | |
| 2008/0276979 A1* | 11/2008 | Lagally et al. | 136/239 |
| 2008/0315430 A1 | 12/2008 | Weber et al. | |
| 2009/0137091 A1 | 5/2009 | Lee | |
| 2009/0155999 A1* | 6/2009 | Chen et al. | 438/664 |
| 2010/0096618 A1 | 4/2010 | Iacopi et al. | |
| 2010/0193770 A1 | 8/2010 | Bangsaruntip et al. | |
| 2011/0227157 A1* | 9/2011 | Yang et al. | 257/347 |

FOREIGN PATENT DOCUMENTS

EP 1936666 A1 6/2008

* cited by examiner

*Primary Examiner* — Kevin Parendo
(74) *Attorney, Agent, or Firm* — Louis J. Percello; Michael J. Chang, LLC

(57) ABSTRACT

Techniques for silicide, germanide or germanosilicide formation in extremely small structures are provided. In one aspect, a method for forming a silicide, germanide or germanosilicide in a three-dimensional silicon, germanium or silicon germanium structure having extremely small dimensions is provided. The method includes the following steps. At least one element is implanted into the structure. At least one metal is deposited onto the structure. The structure is annealed to intersperse the metal within the silicon, germanium or silicon germanium to form the silicide, germanide or germanosilicide wherein the implanted element serves to prevent morphological degradation of the silicide, germanide or germanosilicide. The implanted element can include at least one of carbon, fluorine and silicon.

16 Claims, 3 Drawing Sheets

SILICIDATION WITH
3 nm NiPt

SILICIDATION WITH
5 nm NiPt

SILICIDATION WITH
10 nm NiPt

METHOD TO ENABLE THE PROCESS AND ENLARGE THE PROCESS WINDOW FOR SILICIDE, GERMANIDE OR GERMANOSILICIDE FORMATION IN STRUCTURES WITH EXTREMELY SMALL DIMENSIONS

FIELD OF THE INVENTION

The present invention relates to silicide, germanide or germanosilicide formation and more particularly, to techniques for silicide, germanide or germanosilicide formation in structures with extremely small dimensions, such as suspended nanowires.

BACKGROUND OF THE INVENTION

When the dimensions of structures, such as silicon nanowires, are extremely small, processing these structures without damaging them is a challenge. For example, silicidation of a nanowire array is very difficult to carry out without causing at least some of the wires to break during the process. Breakage is especially prevalent when the nanowires are suspended.

Silicidation, in general, involves depositing a metal such as nickel on the silicon structure and then annealing the structure to intersperse the metal within the silicon. Silicidation is used in many different contexts of device fabrication. By way of example only, silicidation is used to form source and drain regions in nanowire-channel based transistors.

With extremely small structures, problems arise during the anneal. Specifically, there is a very small process window outside of which if a little too much metal is deposited then the structures break (which is thought to be stress related). This action, in the case of a nanowire for example, will undesirably cause the wire to sever.

Therefore, techniques that permit processing, e.g., silicidation, of structures with extremely small dimensions, such as nanowires, without causing the structures to break would be desirable.

SUMMARY OF THE INVENTION

The present invention provides techniques for silicide, germanide or germanosilicide formation in extremely small structures. In one aspect of the invention, a method for forming a silicide, germanide or germanosilicide in a three-dimensional silicon, germanium or silicon germanium structure having extremely small dimensions is provided. The method includes the following steps. At least one element is implanted into the structure. At least one metal is deposited onto the structure. The structure is annealed to intersperse the metal within the silicon, germanium or silicon germanium to form the silicide, germanide or germanosilicide wherein the implanted element serves to prevent morphological degradation of the silicide, germanide or germanosilicide. The implanted element can include at least one of carbon, fluorine and silicon.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming a silicide, germanide or germanosilicide in extremely small structures without the problems (such as breakage) which are associated with conventional processes. By way of example only, the structures referred to herein can be three-dimensional structures having extremely small dimensions, such as nanowires. The present techniques are, however, not limited to three-dimensional structures. A silicide, germanide or germanosilicide may be formed in thin (silicon, germanium or silicon germanium) films using the present techniques. Films having a thickness of less than or equal to about 10 nanometers (nm), e.g., from about 2 nm to about 10 nm, are considered herein as having extremely small dimensions. Further, the present techniques are not limited to structures having small dimensions. The present process can be employed in conjunction with forming a silicide, germanide or germanosilicide in any silicon, germanium or silicon germanium structure.

FIGS. 1-5 are diagrams illustrating an exemplary process for forming a silicide, germanide or germanosilicide in structures (in this case nanowires) with extremely small dimensions. Whether a silicide, germanide or germanosilicide is formed is dependent on whether the structures contain silicon, germanium or silicon germanium, respectively. In the example described below, the process begins by providing a wafer having a semiconductor layer over an insulator. The structures will be formed in the semiconductor layer. Thus, by way of example only, when the structures are silicon structures, the wafer can be a silicon-on-insulator (SOI) wafer. An SOI wafer typically includes an SOI layer (which in this case serves as the semiconductor layer) separated from a substrate (e.g., a silicon substrate) by a buried oxide (BOX) insulator. For a detailed depiction of the insulator, e.g., BOX, and substrate see, for example, FIG. 2, described below. Alternatively, the semiconductor layer can contain germanium or silicon germanium. The techniques for implementing these variations in the wafer structure would be apparent to those of skill in the art and thus are not described further herein.

Since the structures will be formed in the semiconductor layer, in order to produce structures having extremely small dimensions the semiconductor layer in this example is thin, i.e., preferably having a thickness of from about 3 nm to about 50 nm. In the case of an SOI wafer, an SOI layer having such a small thickness is also referred to herein as an extremely thin silicon-on-insulator (ETSOI) layer.

Figure 1:
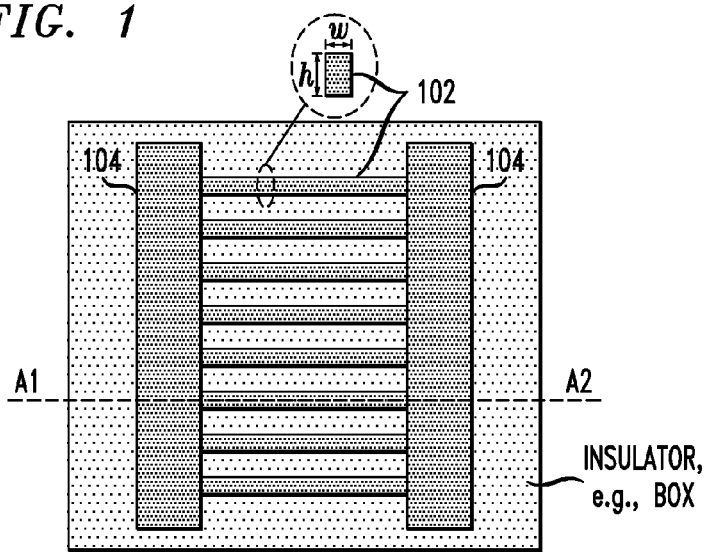
FIG. 1 is a top-down diagram of an array of three-dimensional structures and pads having been formed in a silicon, germanium or silicon germanium layer over an insulator according to an embodiment of the present invention.

An array of three-dimensional structures 102 (e.g., nanowires) is then formed in the semiconductor layer using a conventional lithography process. In this example, the structures are formed with pads attached at opposite ends thereof in a ladder-like configuration. See, for example, FIG. 1. FIG. 1 is a top-down diagram of structures 102 and pads 104 having been formed in the thin semiconductor layer over the insulator with pads 104 attached at opposite ends of structures 102 in a ladder-like configuration wherein the structures 102 resemble rungs of a ladder. This device structure is provided merely to illustrate how the present techniques can be employed for silicide, germanide or germanosilicide formation in an array of extremely small structures.

Structures 102 formed by lithography, as shown in FIG. 1, generally have a rectangular cross-sectional shape. According to an exemplary embodiment, the structures have a cross-sectional width w of from about 3 nm to about 50 nm and a cross-sectional height h of from about 3 nm to about 50 nm, which are considered herein to be extremely small dimensions. Nanowires having a rectangular cross-sectional shape may also be referred to herein as "fins." The dimensions of structures 102 are based on the thickness of the semiconductor (e.g., ETSOI) layer. For example, the height h of each structure 102 corresponds to the thickness of the semiconductor layer (and in the case of fins should be at least as large as the width w of the fin). Additional steps (e.g., oxidation and hydrofluoric (HF) acid etching), if desired, may be performed to change the cross-sectional shape of structures 102 to make them more round. In that case, according to an exemplary embodiment, the structures have a cross-sectional diameter d of less than or equal to about 10 nm, for example, from about 2 nm to about 10 nm (see, for example FIG. 2, described below), which is considered herein to be an extremely small dimension.

Figure 2:
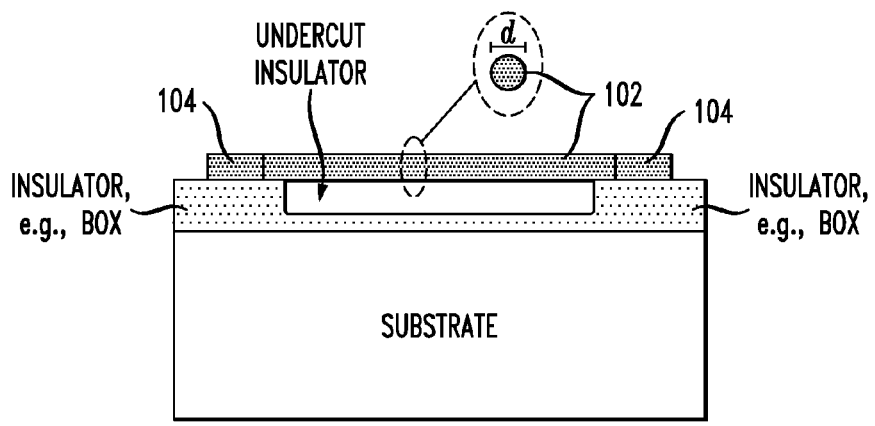
FIG. 2 is a cross-sectional diagram of the structures having been suspended according to an embodiment of the present invention.

As highlighted above, breakage is a concern with conventional silicidation processes and extremely small structures, especially when the structures are suspended. Thus, to further illustrate the benefits of the present techniques in that context, an example is now considered wherein structures 102 are suspended. Namely, FIG. 2 is a cross-sectional diagram, i.e., through line A1-A2 of the structure of FIG. 1, illustrating structures 102 having been suspended over the insulator. Suspension of structures 102 can be accomplished by undercutting the insulator beneath a portion of each structure 102. As highlighted above, the structures 102 can be reshaped (if desired) to give them a more round cross-sectional shape. For illustrative purposes, in the example shown in FIG. 2, this re-shaping process has been done. It is notable that for the purposes of the present techniques, it makes no difference whether the structures are part of an array (as in FIGS. 1-5), or are individual, isolated structures (e.g., isolated nanowires as in FIGS. 6A-C). Specifically, the structures in this case are so small that the metal deposition and reaction is not sensitive to the density of the structures. Thus, the same result is achieved with either arrays or isolated structures.

Figure 3:
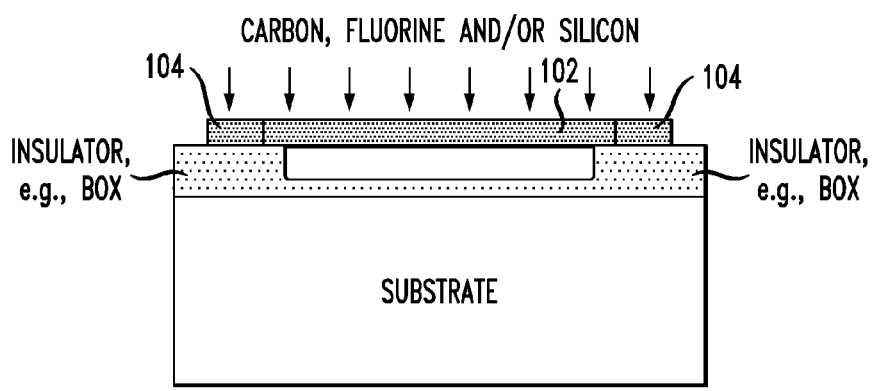
FIG. 3 is a cross-sectional diagram illustrating an element or elements being implanted into the structures according to an embodiment of the present invention.

Advantageously, it has been discovered by way of the present techniques that implanting an element or elements into the structures prevents breakage thereof during subsequent silicide, germanide or germanosilicide formation processes. FIG. 3 is a cross-sectional diagram illustrating this implantation step. As shown in FIG. 3 one or more elements are being implanted into structures 102 (i.e., nanowires). According to an exemplary embodiment, the implanted element(s) includes carbon, fluorine and/or silicon. The element(s) are implanted into the structures 102 using a conventional implantation process which involves bombarding the target (i.e., structures 102) with the element(s) which have been accelerated to a high velocity. Element implantation techniques are known to those of skill in the art and thus are not described further herein. According to an exemplary embodiment, the element(s) are implanted into each of the structures at a dose of from about $1\times10^{13}$ per square centimeter ($cm^2$) to about $5\times10^{15}$ per $cm^2$.

In blanket thin films of metal reacting with planar silicon, the presence of the implanted element(s) has been found to have two easily measured consequences. The first is an increase in formation temperature and the second is an increase in the temperature necessary for the film to agglomerate (morphological degradation). For agglomeration to occur, both species (the metal and the silicon, germanium or silicon germanium) must be mobile in the compound. It is believed that the implanted element(s) reduces metal diffusion to some extent but is much more effective at limiting silicon, germanium or silicon germanium diffusion within the respective silicide, germanide or germanosilicide and therefore limits agglomeration of the thin film. Since agglomeration is very sensitive to both the surface-to-volume ratio of the silicide, germanide or germanosilicide and to possible stress at the temperatures used during the subsequent anneal (see below), the presence of the implanted element(s) in three-dimensional structures such as nanowires drastically helps in preventing morphological degradation of the silicide, germanide or germanosilicide.

With conventional silicidation processes involving small structures, the process window regarding the amount of metal employed is very small. Namely, if one deposits too much metal, the final phases formed upon annealing will become metal-rich. These metal-rich phases are known to exhibit compressive stress when formed through metal diffusion because of large volume expansion as compared to the silicon, germanium or silicon germanium volume consumed. This compressive stress inevitably causes breakage of the structures during/after the silicide, germanide or germanosilicide formation. Too little metal causes the volume of silicide, germanide or germanosilicide to be reduced as well causing a large increase in resistance throughout the structure.

For the current state of the art, a major problem of selecting a metal thickness resides in the fact that in a given technology, one would expect to encounter structures (e.g., nanowires) of varying dimensions (e.g., width, height, diameter, etc.). Even with structures that would nominally have the same dimensions, variability in the process of 1 or 2 nanometers would be sufficient to require different deposited metal thicknesses, which is not feasible across a single wafer. Thus, with conventional processes, the structures having the smallest dimensions dictate how much metal overall can be deposited for silicide, germanide or germanosilicide formation. For example, it is undesirable to put a silicon nanowire in contact with more metal than there is silicon, as any metal rich formation would lead to destruction of the wire due to the drive to form the metal silicide and the high diffusivity of the metal. Naturally, in this case, the amount of metal suitable for the smallest structure in an array (for example the smallest nanowire in a nanowire array) is not necessarily correct for the larger structures (the larger nanowires in the array), and vice versa. As a result, if too little metal is used, so as to accommodate (i.e., to prevent breakage of) the smaller structures then the larger structures exhibit an unacceptably large resistance. Conversely, if more metal is used to achieve a desirable resistance in the larger structures, then breakage of the smaller structures is the inevitable result.

Advantageously, the present techniques greatly expand the process window, and allow for a sufficient amount of metal to be deposited to accommodate the larger structures, so as to achieve desirable resistance properties, without resulting in breakage of the smaller structures. This beneficial feature is the result of the implanted element(s) which limits diffusion of the metal in the formed silicide, germanide or germanosilicide and prevents morphological degradation for any metal thickness deposited. See, for example, FIGS. 6A-C, described below.

Figure 4:
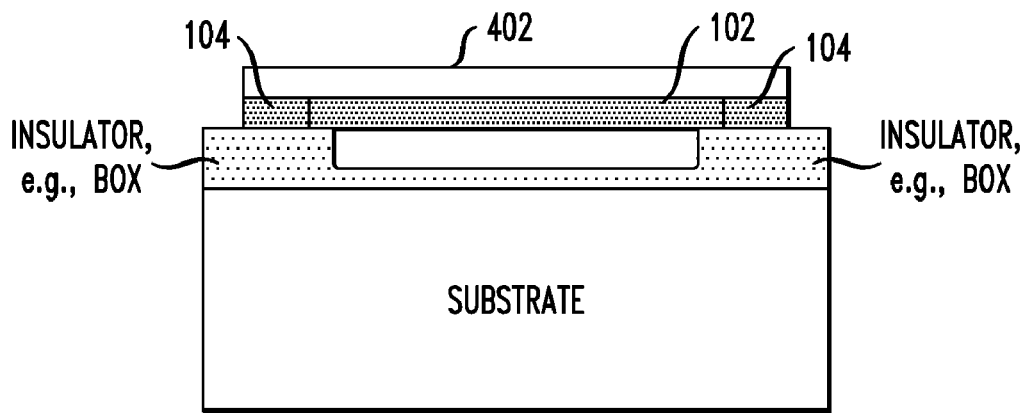
FIG. 4 is a cross-sectional diagram illustrating a metal having been deposited onto the structures according to an embodiment of the present invention.

After the element implantation, the silicide/germanide/germanosilicide-forming metal is deposited onto the structures. For example, FIG. 4 is a cross-sectional diagram illustrating a metal 402 having been deposited onto structures 102 (and on pads 104). According to an exemplary embodiment, the metal is nickel, platinum, titanium, cobalt, chromium, yttrium and/or alloys containing at least one of the foregoing metals, such as a nickel-platinum alloy. The metal can be deposited onto structures 102 using any suitable deposition process, such as sputtering, electron beam (e-beam) evaporation and chemical vapor deposition (CVD).

Figure 5:
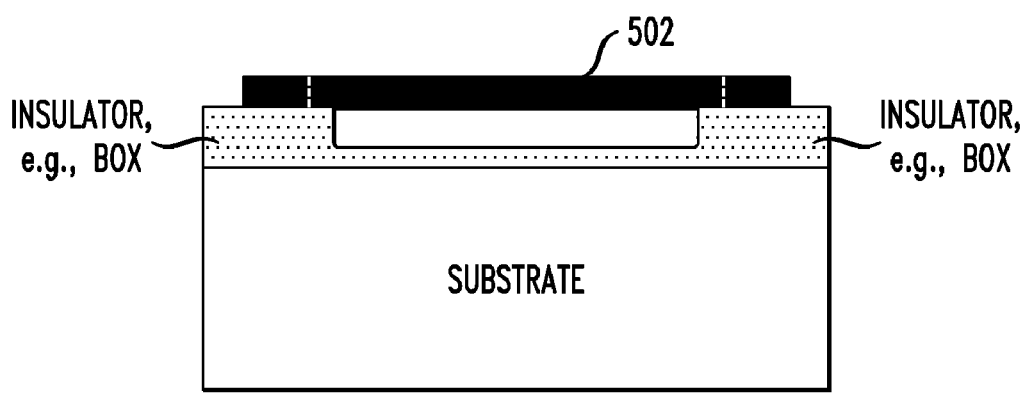
FIG. 5 is a cross-sectional diagram illustrating an anneal having been performed to intersperse the metal and the silicon, germanium or silicon germanium in the structures to form a silicide, germanide or germanosilicide according to an embodiment of the present invention.

As highlighted above, structures 102 and the corresponding pads can be made of silicon, germanium or silicon germanium. FIG. 5 is a cross-sectional diagram illustrating an anneal having been performed to intersperse metal 402 within the silicon, germanium or silicon germanium (in structures 102 and pads 104) to respectively form a silicide, germanide or germanosilicide 502. According to an exemplary embodiment, the anneal is performed at a temperature of from about 300 degrees Celsius (° C.) to about 700° C., for a duration of from about 1 second to about 1 hour. Because the structures involved have such small dimensions, a fast anneal (such as a flash or laser anneal) may instead be used. In the case of a flash anneal, the anneal temperature would be increased to from about 600° C. to about 1,000° C. and the duration of the anneal would be greatly reduced, e.g., to from about 1 millisecond to about 1 microsecond. Even shorter durations, e.g., from about 1 nanosecond to about 3 nanoseconds, can be expected with an excimer laser. Flash annealing and laser annealing are techniques known to those of skill in the art and thus are not described further herein. Following the anneal, any unreacted metal (e.g., metal deposited on non-silicon, non-germanium or non-silicon germanium surfaces) can be removed using a wet etch.

Advantageously, with the present techniques, the structures will not break (agglomerate) during the anneal. This is a consequence of the element implant being performed prior to the metal deposition.

In FIG. 5 it is shown that the silicide, germanide or germanosilicide fully consumes the silicon, germanium or silicon germanium in the pads 104. For example, in the case of a silicide the pads would thus be fully silicided. This is however not a requirement. Depending on the particular application at hand, the silicide, germanide or germanosilicide may only partially consume the silicon, germanium or silicon germanium in the pads. For example, in the case of a silicide the pads may be partially silicided. One of skill in the art, given the present teachings, would know how to achieve and implement either configuration.

Figure 6A:
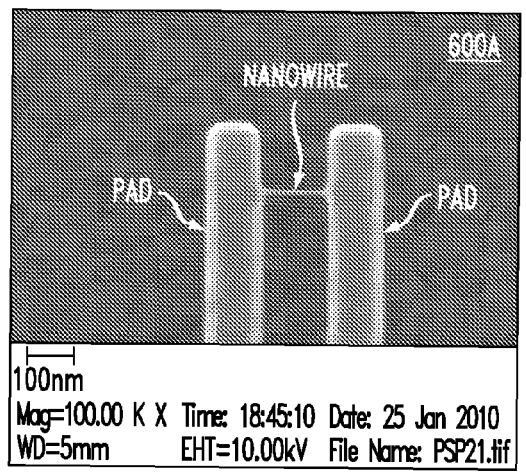
FIGS. 6A-C are images illustrating the silicidation of 5 nanometer (nm) silicon nanowires using the present techniques with varying amounts of metal being used to form the silicide according to an embodiment of the present invention.
Figure 6B:
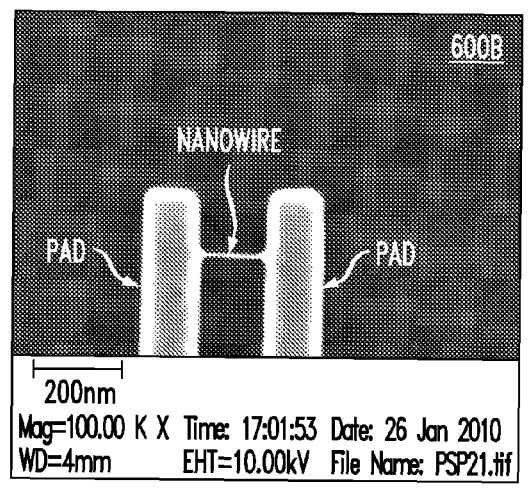
Figure 6C:
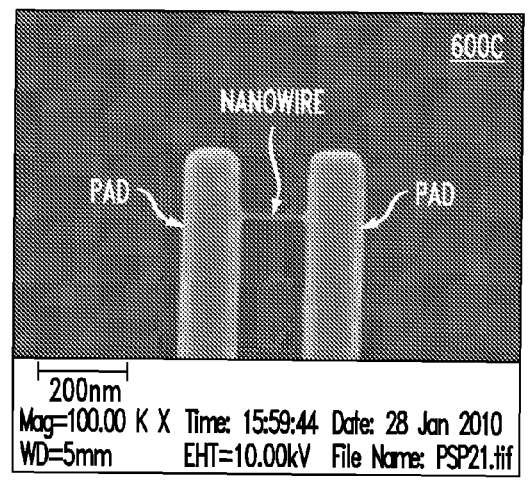

FIGS. 6A-C are images 600A-C illustrating the silicidation of 5 nm (diameter) silicon nanowires (each sample contains an individual nanowire) using the present techniques (with carbon as the implanted element) with varying amounts of metal (in this case nickel-platinum (NiPt)) being used to form the silicide. In the samples shown in FIGS. 6A-C, a 3 nanometer thick, a 5 nanometer thick and a 10 nanometer thick, respectively, nickel-platinum layer was deposited on the given nanowire. After the anneal, the nanowires in each of the samples remain intact as shown. By comparison, with conventional techniques, breakage did occur in each of these samples and wires were simply removed by the process (not present after standard silicidation).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a silicide, germanide, or germanosilicide in a three-dimensional silicon, germanium, or silicon germanium structure, the method comprising the steps of:
    implanting at least one element into the structure wherein the structure comprises a suspended nanowire;
    depositing at least one metal onto the structure; and
    annealing the structure to intersperse the metal within the silicon, germanium, or silicon germanium to form the silicide, germanide, or germanosilicide wherein the implanted element serves to prevent morphological degradation of the silicide, germanide, or germanosilicide to prevent breakage of the structure.

2. The method of claim 1, wherein the implanted element comprises at least one of carbon, fluorin, and silicon.

3. The method of claim 1, further comprising the steps of:
    providing a wafer having a semiconductor layer over an insulator; and
    forming the structure in the semiconductor layer.

4. The method of claim 3, wherein the wafer is a silicon-on-insulator (SOI) wafer having an SOI layer over a buried oxide (BOX) insulator.

5. The method of claim 4, wherein the SOI layer has a thickness of from about 3 nanometers to about 50 nanometers.

6. The method of claim 3, further comprising the step of:
    undercutting the insulator under a portion of the structure.

7. The method of claim 1, further comprising the step of:
    using a wet etch to remove any unreacted metal.

8. The method of claim 1, wherein the nanowire has a round cross-sectional shape.

9. The method of claim 8, wherein the nanowire has a cross-sectional diameter of less than or equal to about 10 nanometers.

10. The method of claim 1, wherein the nanowire has a rectangular cross-sectional shape.

11. The method of claim 10, wherein the nanowire has a width of from about 3 nanometers to about 50 nanometers and a height of from about 3 nanometers to about 50 nanometers.

12. The method of claim 1, wherein the element is implanted into the structure at a dose of from about $1 \times 10^{13}$ per square centimeter to about $5 \times 10^{15}$ per square centimeter.

13. The method of claim 1, wherein the metal comprises nickel, platinum, titanium, cobalt, chromium, yttrium, or alloys comprising at least one of the foregoing metals.

14. The method of claim 1, wherein the metal comprises nickel-platinum.

15. The method of claim 1, wherein the structure is annealed at a temperature of from about 300° C. to about 700° C., for a duration of from about 1 second to about 1 hour.

16. The method of claim 1, wherein the silicide, germanide or germanosilicide contains at least one of carbon, fluorine and silicon after the annealing step.

* * * * *